United States Patent [19]

Ido

[11] Patent Number: 5,373,468
[45] Date of Patent: Dec. 13, 1994

[54] SEMICONDUCTOR MEMORY DEVICE

[75] Inventor: Takaaki Ido, Kasugai, Japan

[73] Assignee: Fujitsu Limited, Kawasaki, Japan

[21] Appl. No.: 188,771

[22] Filed: Jan. 31, 1994

[30] Foreign Application Priority Data

Mar. 19, 1993 [JP] Japan .................. 5-060776

[51] Int. Cl.$^5$ .............................................. G11C 7/00
[52] U.S. Cl. .......................... 365/189.05; 365/189.01; 365/190; 365/230.06; 365/230.08
[58] Field of Search .............. 365/189.05, 189.01, 365/190, 202, 230.06, 230.08, 154

[56] References Cited

U.S. PATENT DOCUMENTS

5,276,650  1/1994  Kubota .............................. 365/190

FOREIGN PATENT DOCUMENTS

63-42093   2/1988  Japan .
1-178199   7/1989  Japan .
3-76095    4/1991  Japan .
3-259495  11/1991  Japan .

*Primary Examiner*—Eugene R. LaRoche
*Assistant Examiner*—Tan Nguyen
*Attorney, Agent, or Firm*—Staas & Halsey

[57] ABSTRACT

A semiconductor memory device comprises a memory cell array including a plurality of adjacently disposed first and second memory cell pairs, with bit lines defined in the memory cell array. Switching elements are interposed between the memory cells and the bit lines. Word lines are connected to the switching elements, for selecting one of the memory cells by operating the switching elements, so that data is written on and is read out from selected memory cell through the bit lines. Each bit line is arranged between the first and second memory cells, so that each bit line serves as a common bit line to the first and second memory cells. A buffer circuit is connected to each word line and the buffer circuit transmits the first, second and third select signals each having a different voltage level from each other. The switching elements are respectively connected to the first and second memory cells. The switching element connected to the first memory cell is turned on in response to the first select signal, the switching element connected to the second memory cell is turned on in response to the second select signal, and the switching elements respectively connected to the first and second memory cells is turned off in response to the third select signal.

7 Claims, 5 Drawing Sheets

| A | B | B̄ | X |
|---|---|---|---|
| L | L | H | L |
| H | L | H | H |
| L | H | L | M |
| H | H | L | M |

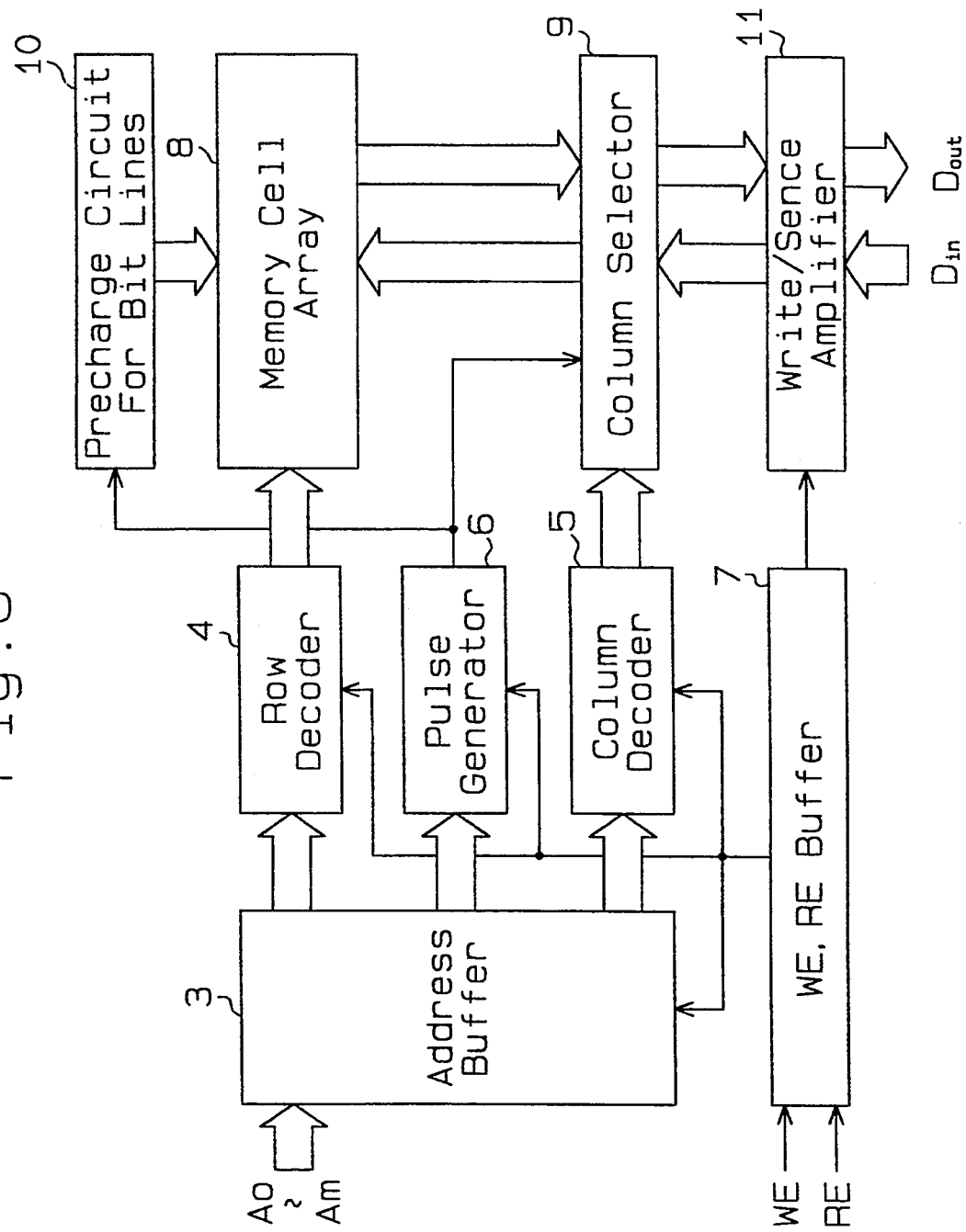

SEMICONDUCTOR MEMORY DEVICE

BACKGROUND OF THE INVENTION

1. Field of the Invention

The present invention relates generally to a semiconductor memory device, more specifically, to a static random access memory (hereinafter referred to as SRAM).

2. Description of the Related Art

Recently, storage capacities of a semiconductor memory devices have increased to such a extent that memory devices no longer require the size they once needed to perform a particular function. To further increase the memory capacity and to decrease the dimensional size of semiconductor memory devices, a reduction of the number of bit lines in cell arrays is herewith proposed by the following invention.

FIG. 1 illustrates a first conventional device of SRAM. A plurality of memory cells C00 through Cmn are coupled via switching elements SW000 through SW1mn, to multiple pairs of bit and bar bit lines, BL0 through BLm and bar BL0 through BLm, respectively. Memory cells C00 through Cmn are formed using a latch circuit with two CMOS invertor circuits as memory cell elements. Each of the switching elements SW000 through SW1mn is constructed with a n-channel MOS transistor, and is coupled to one of the word lines WL0 through Wln. When any one word line is selected by a decoder, and the state of the selected word line goes high, the switching element coupled to the selected word line is switched to the ON state. Following this, a memory cell coupled to the activated switching element is selected, and data is read or written from or to the selected memory cell via one from bit lines BL0 and bar BL0 through BLm and bar BLm.

According to the above-described SRAM, a pair of bit lines is provided to a series of memory cells. Therefore, the number of bit lines increases in proportion to the increase in the number of cell arrays. With the large scale cell arrays manufactured today, design constraints require increasingly larger areas for bit line layout. In an attempt to decrease the number of the bit lines, a SRAM having a structure shown in FIG. 2 has been proposed, wherein the previous and adjacent bit lines shown separated as in FIG. 1, are combined to one common bit line.

However, there are disadvantages of using such types of SRAM when reading and writing data from or to adjacently disposed memory cells, e.g., from cells C00, C10 coupled to the common word line WL0. For example, if the word line WL0 is selected during a time when data is stored in the memory cells C00, C10, and in a case where an output from one of two memory cells connected to a common bit line is high and an cell C10 to the cell C00 as shown in FIG. 2. This causes the state of the bit line bar BL1, between both cells C00 and C10, to be intermediately biased between high and low voltage states, which in turn results in a condition where the data stored in memory can not be accurately read.

To solve the above-described drawbacks, Japanese Unexamined Patent Publication Nos. 63-42093 and 3-259495 disclose SRAMs in which clamp circuits are provided to the bit lines in order to suppress variations in bit line voltage potential.

Further, Japanese Unexamined Patent Publication No. 3-76095 discloses a SRAM, in which each of the adjacent memory cells is selected by a separate word line in order to reduce the interference between adjacent memory cells. This construction, however, causes an accompanying decrease in memory cell access time. Also, the variation in the range of voltage potential for circuitry using such bit lines is reduced, making it more likely that noise inherent to the circuit would exceed the circuit's threshold noise level. This bit line construction, thus, creates a tendency for the circuit to be overly effected by noise. Finally, with the SRAM disclosed in Japanese Unexamined Patent Publication No. 3-76095, as the number of word lines increases, the advantage of combining bit lines to reduce the layout area is diminished by the additional space needed for the increased number of word lines.

SUMMARY OF THE INVENTION

It is therefore an object of the present invention to provide a semiconductor memory device that permits an overall reduction in the area required for chip layout, that prevents interference between adjacently disposed memory cells, that reduces the amount of cell access time, and that inhibits the noise inherent in such circuits.

To achieve the above objects, a semiconductor memory device, according to the present invention is provided which comprises a memory cell array having a plurality of adjacent first and a second memory cell pairs formed having CMOS inverter circuitry included therein. Bit lines are defined in the memory cell array, and switching elements, each of which connects to a memory cell pair, are interposed between the memory cells and the bit lines. Data is read or written to an individual memory cell on bit lines when a word line selects a particular memory cell via the corresponding switching element disposed between the cell and the bit line. Each bit line is arranged between the first and second memory cell, so that each bit line serves as a common bit line to the first and second memory cells. A buffer circuit, connected to each word line, transmits a first, a second, and a third select signals each having a different voltage level. The switching element connected to the first memory cell is turned on in response to the first select signal, the switching element connected to the second memory cell is turned on in response to the second select signal, and the switching elements respectively connected to the first and second memory cells are turned off in response to the third select signal.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings, in which:

FIG. 6 is a block diagram showing an entire structure of the SRAM.

DESCRIPTION OF THE PREFERRED EMBODIMENT

Figure 3:
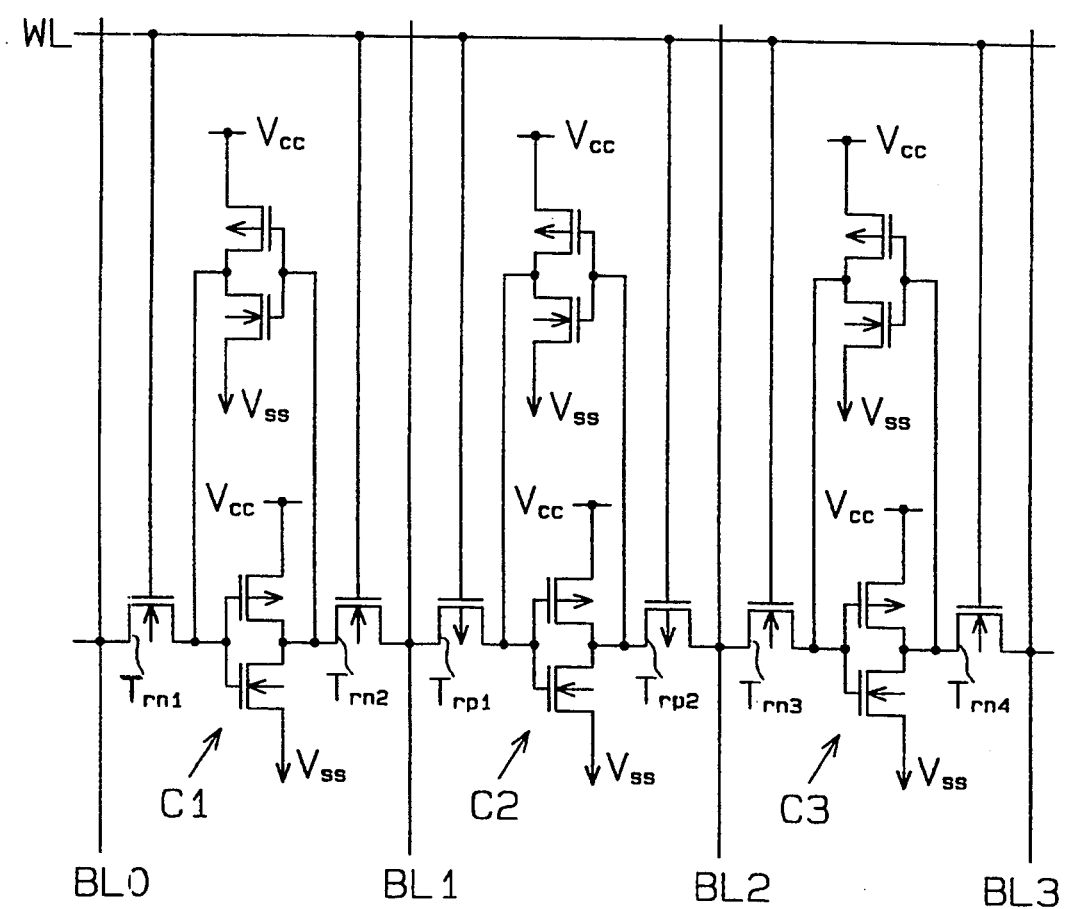
FIG. 3 is a circuit diagram of an SRAM according to a preferred embodiment of the present invention.

A preferred embodiment of the present invention will now be described referring to the accompanying drawings. FIG. 3 illustrates a portion of the cell array of a SRAM according to the invention including, memory cells C1 through C3, bit lines BL0 through BL3, a word line WL coupled to a plurality of memory cells, and switching elements Trn1 through Trn4, Trp1, and Trp2 that are coupled with memory cells C1 through C3 and bit lines BL0 through BL3, respectively. The memory cell C1 is coupled to the bit line BL0 via an N-channel MOS transistor as the switching element Trn1, and is also coupled to the bit line BL1 via an N-channel MOS transistor as the switching element Trn2. Similarly, the memory cell C2 is coupled to the bit line BL1 via a P-channel MOS transistor as the switching element Trp1, and is coupled to the bit line BL2 via a P-channel MOS transistor as the switching element Trp2. The memory cell C3 is coupled to the bit line BL2 via an N-channel MOS transistor as the switching element Trn3, and is coupled to the bit line BL3 via an N-channel MOS transistor as the switching element Trn4. Bit line BL1 thus serves as a common bit line to the memory cells C1, C2. Similarly, the bit line BL2 serves as a common bit line to the memory cells C2, C3.

Transistors Trn1 through Trn4 are selectively enabled at threshold values set higher than the intermediate voltage level maintained between the power sources Vcc and Vss. Transistors Trp1, Trp2 are selectively enabled at threshold values set lower than the intermediate voltage level maintained between the power sources Vcc and Vss. Accordingly, transistors Trn1 through Trn4, Trp1 and Trp2 are deactivated when each has an intermediate potential level applied thereto. In the adjacent memory cell pair, an N-channel MOS transistor, used as a switching element, is coupled to one cell, and a P-channel MOS transistor, also used as a switching element, is coupled to the other cell. The gates of transistors Trn1 through Trn4, Trp1, Trp2 are coupled to one common word line WL. The state of word line WL, is selectively set at either high or low potential level, and is deselected when set to an intermediate potential level. A row decoder described hereafter, determines the state of the word line WL.

Figures 4, 5:
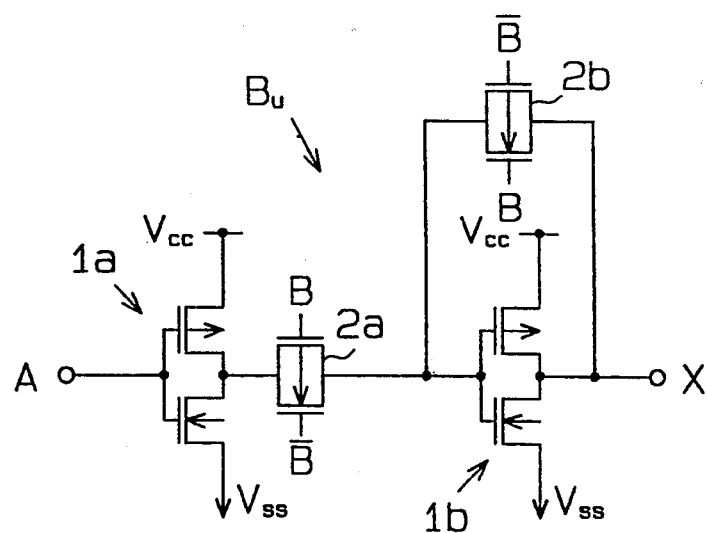
FIG. 4 is a circuit diagram of buffer circuit that drives a word line in the preferred embodiment.
FIG. 5 is an explanatory chart showing operational logic of the buffer circuit.

FIG. 4 shows a buffer circuit Bu, according to the invention, that drives the word line WL. The row decoder 4 outputs input signals A, B, bar B. The input signal A is input to a CMOS invertor circuit 1a constructed with a P-channel and an N-channel MOS transistors. An output signal from the invertor circuit 1a is coupled to a CMOS invertor circuit 1b via a transfer gate 2a. The CMOS invertor circuit 1b outputs a select signal X to the word line WL. The input signal B is coupled to a gate at the P-channel side of the transfer gate 2a. The input signal bar B is coupled to a gate at N-channel side of the transfer gate 2a. An input terminal and an output terminal of the invertor circuit 1b are coupled each other via the transfer gate 2b. The input signal bar B is coupled to the gate at P-channel side of the transfer gate 2b. The input signal B is coupled to a gate at N-channel side of the transfer gate 2b.

FIG. 5 shows the logic operations for the above-described buffer circuit Bu. When the state of input signal B goes low and the input signal bar B goes high, the transfer gate 2a is activated while gate 2b is deactivated. Consequently, the input signal A is output low as a select signal X via the invertor circuits 1a, 1b. If the state of the input signal A is high under the same conditions, the state of the select signal X goes high. Under the conditions when the input signal B goes high and the input signal bar B goes low, the transfer gate 2a is deactivated and the gate 2b is activated. Given this state, both the output signal from the invertor circuit 1a is decoupled from the invertor circuit 1b, since the circuit between the input and output terminals of the invertor circuit 1b is short-circuited, and the state of the select signal X goes to an intermediate level (M), i.e., the threshold value of the invertor 1b. A plurality of word lines WL in the cell array have buffer circuits Bu employing the above-described structure.

The entire structure of an SRAM having the above-described cell array will now be described referring to FIG. 6. Address signals A0 through Am are output to the row decoder 4, column decoder 5 and pulse generator 6 via an address buffer 3. A write enable signal WE and RAM enable signal RE are coupled to a WE, RE buffer 7. An output signal from the WE, RE buffer 7 controls the address buffer 3, row decoder 4, column decoder 5 and pulse generator 6. The row decoder 4 selects the specific word line disposed in the memory cell array 8, based upon the address signals A0 through Am. The column decoder 5 selects the specific bit line disposed in the memory cell array 8 through a column selector 9, based upon the address signals A0 through Am. The pulse generator 6 outputs a pulse signal to the column selector 9 and a precharging circuit for bit line 10 based upon the change in the address signals A0 through Am. The precharging circuit 10 precharges the bit lines according to timing of the output signal from the pulse generator 6. The column selector 9 selects the bit line according to timing of the output signal from the pulse generator 6. The output signal from the WE, RE buffer 7 is also output to a write/sense amplifier 11. When the data writing operation is carried out, the write/sense amplifier 11 outputs data Din to be written to the bit line based on the output signal from the WE, RE buffer 7. When the data reading operation is carried out, the write/sense amplifier 11 amplifies the cell information that are read out to the selected bit line, and outputs the amplified information as data Dout.

Figure 1:
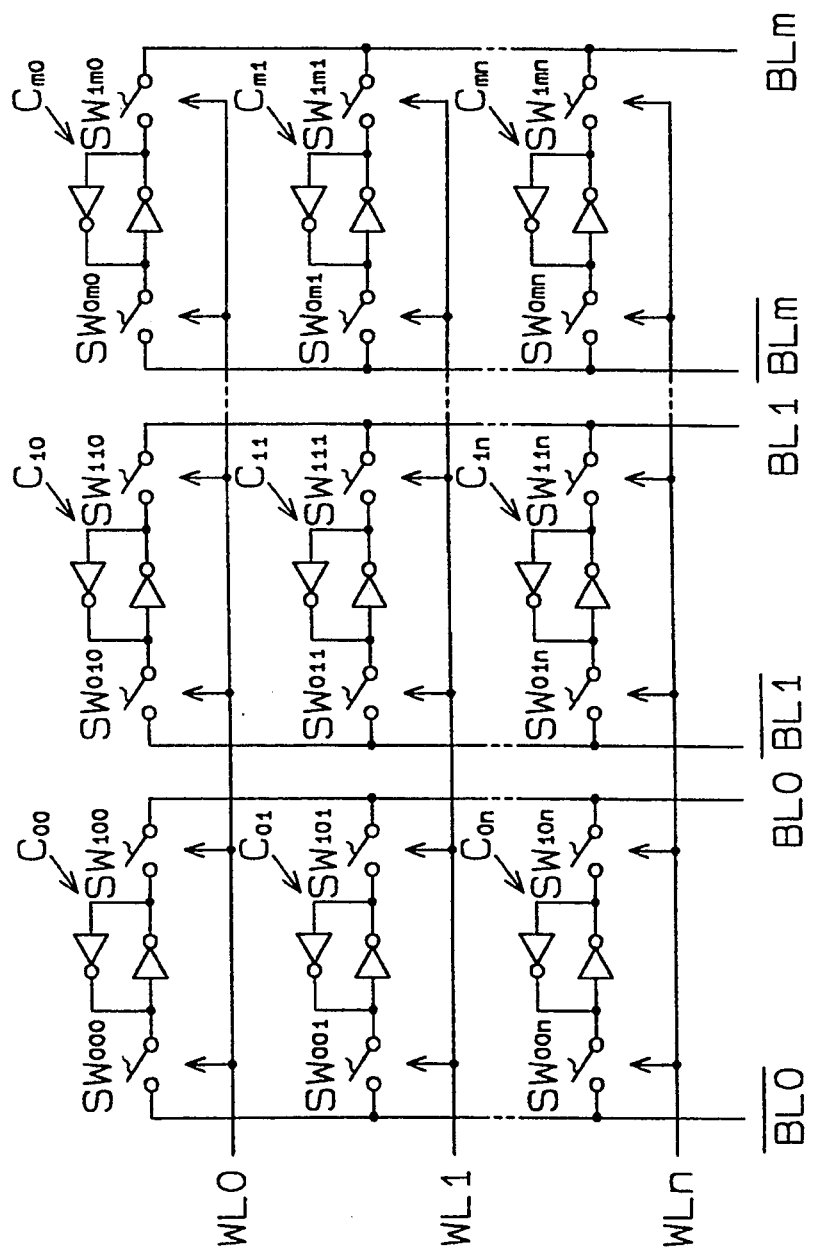
FIG. 1 is a circuit diagram according to a first conventional cell array in an SRAM.
Figure 2:
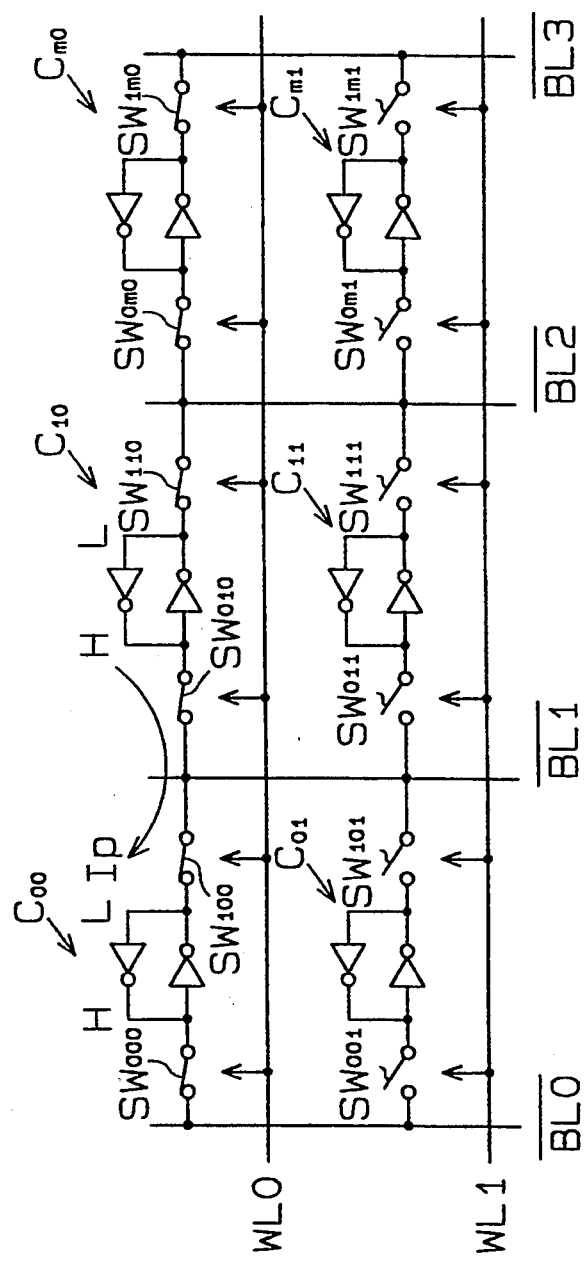
FIG. 2 is a circuit diagram according to a second conventional cell array in an SRAM.

Operations of the SRAM having the above-described structure will now be described. When a word line WL is selected based upon the operation of the row decoder 4, the state of the input signal B of the buffer circuit Bu shown in FIG. 4, goes low, while the state of the input signal bar B thereof goes high. If the state of the input signal A goes low while the input signals B, bar B are in the above-described states, the state of the word line goes low due to the selected signal X. Accordingly, the transistors Trn1 through Trn4 shown in FIG. 2 are deactivated at the same time that the transistors Trp1, Trp2 are activated. As a result, the information stored in the memory cell C2 is read out to the bit lines BL1, BL2 while the information stored in the memory cells C1, C3 remains unread. When the state of the input signal A goes high, the state of the word line WL goes high due to the select signal X. Then, the transistors Trn1 through Trn4, shown in FIG. 2, are activated, while simultaneously, the transistors Trp1, Trp2 are deactivated. As a result, the information stored in the memory cell C1 is read out to the bit lines BL0, BL1, and the information stored in the memory cell C3 is read out to the bit lines BL2, BL3. However, the information stored in the memory cell C2 remains unread. Accordingly, since the state of the word line WL is either high or low, the information stored in every other memory cell coupled to a single word line is read out to the corresponding bit lines. Therefore, since adjacent memory cells are not simultaneously selected, they will not interfere with each other. In the buffer circuit shown in FIG. 4, when the state of the input signal B goes high and the state of the input signal bar B goes low, the state of the word line WL will be set at an intermediate voltage level. Consequently, all transistors Trn1 through Trn4, Trp1, Trp2 will be deactivated, and any information stored in the memory cell C1 through C3 remains unread.

A CMOS (complementary MOS) inverter is used as a latching circuit within each cell C1, C2, C3 to implement the logic function of the memory cell. A p-channel transistor functions as a pullup device, while the n-channel transistor acts as a pulldown device. The p-channel transistor is turned on by a gate signal that is opposite in polarity to the gate signal required to turn on the n-channel pulldown transistor. The circuit functions as an inverter because of the opposite transfer characteristics of the n-channel pulldown and p-channel pullup transistors.

If a high level signal is input to the CMOS, the P-channel turns off while the n-channel turns on resulting in a low output signal. Conversely, if a low level signal is input to the CMOS, the p-channel turns on while the n-channel turns off resulting in a high output signal. If both p-channel and n-channel are disabled, the output signal is latched either on or off, i.e., either high or low.

As described above, the SRAM according to this embodiment permits information to be read out from the individual memory cells and prevents interference from occurring between adjacent memory cells by setting the state of the word line WL to either a high or low level. The SRAM in this embodiment reduces chip layout area, by combining bit lines to be a common bit line. Further, since the SRAM in this embodiment does not require the clamping of bit line potentials, the invention avoids the decrease of the access speed and performance degradation due to circuit noise common in conventional memory devices.

In the SRAM in this embodiment, each word line requires its own buffer circuit Bu. Although this initially results in an increase in chip layout size, the consolidation of bit lines compensates for the increase in layout area by providing a greater reduction in chip size than the increase occasioned by the buffer circuits.

What is claimed is:

1. A semiconductor memory device comprising:
a memory cell array having a plurality of adjacently disposed first and second memory cells, said cells containing therein a plurality of memory cell elements;
a plurality of bit lines defined in the memory cell array;
a plurality of switching elements interposed between said memory cells and said bit lines, each of said switching elements having a word line coupled thereto for enabling said switching elements to select one from said first and second memory cells, said memory cells being communicatively coupled to said bit lines for transmitting data to and from said memory cells;
said bit lines being arranged between said first and second memory cells such that said bit lines serves as a common bit line between said first and second memory cells and to said memory cell elements;
a buffer circuit connected to each word line, said buffer circuit transmitting a first, a second and a third select signals, each of said first, second, and third signals having a distinct potential voltage level from the other; and
said switching element connected to said first memory cell being turned on in response to said first select signal, said switching element connected to said second memory cell being turned on in response to said second select signal, and said switching elements respectively connected to said first and second memory cells being turned off in response to said third select signal.

2. A semiconductor memory device according to claim 1, wherein each memory cell comprises a latch circuit having two Complementary Metal Oxide Semiconductor (CMOS) inverters.

3. A semiconductor memory device according to claim 1, wherein said switching element connected to said first memory cell comprises an N-channel Metal Oxide Semiconductor (MOS) transistor, and wherein said switching element connected to said second memory cell comprises a P-channel MOS transistor.

4. A semiconductor memory device according to claim 1, wherein said first, second, and third select signals comprises an high level select signal, a medium level select signal, and a low level select signal, respectively.

5. A semiconductor memory device comprising:
a memory cell array having a plurality of adjacently disposed first and second memory cells, said cells containing therein a plurality of memory cell elements;
a plurality of bit lines defined in the memory cell array;
a plurality of switching elements coupled between said memory cells and said bit lines, each of said switching elements having a word line coupled thereto for enabling said switching elements to select one from said first and second memory cells, said memory cells being communicatively coupled to said bit lines for transmitting data to and from said memory cells;
said bit lines being arranged between said first and second memory cells such that said bit lines serves as a common bit line between said first and second memory cells and to said memory cell elements;
one of said plurality of switching elements being connected to said first memory cell comprising an N-channel MOS transistor having a gate connected to said word line;
one of said plurality of switching elements being connected to said second memory cell comprising a P-channel Metal Oxide Semiconductor (MOS) transistor having a gate connected to said word line;
a buffer circuit connected to said word line, said buffer circuit transmitting a high level select signal, a medium level select signal, and a low level select signal to said word line; and
wherein said N-channel MOS transistor turns on in response to said high level select signal transmitted to said word line, said P-channel MOS transistor turns on in response to said low level select signal transmitted to said word line, and said N-channel and P-channel MOS transistors turn off in response to said medium select signal transmitted to said word line.

6. A semiconductor memory device according to claim 5, wherein said buffer circuit comprises:
   a first Complementary Metal Oxide Semiconductor (CMOS) invertor for receiving a first input signal;
   a first transfer gate for transmitting an output signal from said first CMOS invertor and for receiving a first and second complementary signals;
   a second CMOS invertor for receiving an output signal from said first transfer gate;
   a second CMOS invertor connected in parallel to said first CMOS invertor; and
   wherein said second CMOS invertor transmits one of a high level and a low level select signal in-phase with said first input signal when both said first transfer gate turns on and said second transfer gate turns off, and wherein said second CMOS invertor transmits said medium level select signal when both said first transfer gate turns off and said second transfer gate turns on.

7. A semiconductor memory device comprising:
   a memory cell array having a plurality of adjacently disposed first and second memory cells, said cells containing therein a plurality of memory cell elements;
   a plurality of bit lines defined in the memory cell array;
   a plurality of switching elements interposed between said memory cells and said bit lines, each of said switching elements having a word line coupled thereto for enabling said switching elements to select one from said first and second memory cells, said memory cells being communicatively coupled to said bit lines for transmitting data to and from said memory cells;
   said bit lines being arranged between said first and second memory cells such that said bit lines serves as a common bit line between said first and second memory cells and to said memory cell elements;
   said switching element connected to said first memory cell comprising an N-channel Metal Oxide Semiconductor (MOS) transistor having a gate connected to said word line;
   said switching element connected to said second memory cell comprising a P-channel MOS transistor having a gate connected to said word line;
   a buffer circuit connected to said word line, said buffer circuit comprising;
      a first Complementary Metal Oxide Semiconductor (CMOS) invertor for receiving a first input signal,
      a first transfer gate for transmitting an output signal from said first CMOS invertor and for receiving a first and second complementary signals,
      a second CMOS invertor for receiving an output signal from said first transfer gate,
      a second CMOS invertor connected in parallel to said first CMOS invertor, and
      wherein said second CMOS invertor transmits one of a high and low level select signal in-phase with said first input signal when both said first transfer gate turns on and said second transfer gate turn off, and wherein said second CMOS invertor transmits said medium level select signal when both said first transfer gate turns off and said second transfer gate turns on; and
   wherein said N-channel MOS transistor is selectively enabled by said high level select signal transmitted to said word line, said P-channel MOS transistor is selectively enabled by said low level select signal transmitted to said word line, and said N-channel, and said P-channel MOS transistors is selectively disabled by said medium select signal transmitted to said word line.

* * * * *

UNITED STATES PATENT AND TRADEMARK OFFICE
CERTIFICATE OF CORRECTION

PATENT NO. : 5,373,468
DATED : December 13, 1994
INVENTOR(S) : T. Ido

It is certified that error appears in the above-indentified patent and that said Letters Patent is hereby corrected as shown below:

Title page, [73] Assignee: after "Fujitsu Limited, Kawasaki, Japan" insert --Fujitsu VLSI Limited, Kasugai-shi, Japan--.

Signed and Sealed this

Thirteenth Day of May, 1997

*Attest:*

*Attesting Officer*

BRUCE LEHMAN

*Commissioner of Patents and Trademarks*